(12) United States Patent
Zheng et al.

(10) Patent No.: US 11,404,969 B2
(45) Date of Patent: Aug. 2, 2022

(54) INVERTER SYSTEM

(71) Applicant: SUNGROW POWER SUPPLY CO., LTD., Anhui (CN)

(72) Inventors: Hao Zheng, Anhui (CN); Qiyao Zhu, Anhui (CN); Rubin Wan, Anhui (CN); Wei Deng, Anhui (CN)

(73) Assignee: SUNGROW POWER SUPPLY CO., LTD., Anhui (CN)

( * ) Notice: Subject to any disclaimer, the term of this patent is extended or adjusted under 35 U.S.C. 154(b) by 0 days.

(21) Appl. No.: 16/853,647

(22) Filed: Apr. 20, 2020

(65) Prior Publication Data

US 2020/0343823 A1      Oct. 29, 2020

(30) Foreign Application Priority Data

Apr. 26, 2019   (CN) .......................... 201920592419.9

(51) Int. Cl.
| | | |
|---|---|---|
| *H02M 7/00* | (2006.01) | |
| *H05K 5/00* | (2006.01) | |
| *H05K 5/02* | (2006.01) | |
| *H05K 7/20* | (2006.01) | |

(52) U.S. Cl.
CPC .......... *H02M 7/003* (2013.01); *H05K 5/0021* (2013.01); *H05K 5/0247* (2013.01); *H05K 7/209* (2013.01); *H05K 7/20336* (2013.01); *H05K 7/20936* (2013.01)

(58) Field of Classification Search
None
See application file for complete search history.

(56) References Cited

U.S. PATENT DOCUMENTS

| | | | |
|---|---|---|---|
| 6,353,258 B1 | 3/2002 | Inoue et al. | |
| 2007/0076445 A1* | 4/2007 | Boke | H02M 3/3376 |
| | | | 363/17 |
| 2013/0107601 A1* | 5/2013 | Wagoner | H05K 7/203 |
| | | | 363/141 |

(Continued)

FOREIGN PATENT DOCUMENTS

| | | |
|---|---|---|
| CN | 206023592 U | 3/2017 |
| CN | 107425737 A | 12/2017 |

(Continued)

OTHER PUBLICATIONS

Extended European Search Report regarding Application No. 20170319.6 dated Aug. 3, 2020.

*Primary Examiner* — Courtney L Smith
(74) *Attorney, Agent, or Firm* — Harness, Dickey & Pierce, P.L.C.

(57) ABSTRACT

An inverter system is provided, by which the magnitudes of currents flowing through inverter modules are substantially equal. The inverter system includes multiple inverter modules connected in parallel, where input terminals of all the multiple inverter modules are connected to a same direct current input bus, and output terminals of all the multiple inverter modules are connected to a same alternating current output bus. An input contact S1 of the direct current input bus and an output contact S2 of the alternating current output bus are such located that a difference between impedances of any two branches between S1 and S2 does not exceed a preset value.

15 Claims, 8 Drawing Sheets

(56) References Cited

U.S. PATENT DOCUMENTS

| | | | |
|---|---|---|---|
| 2013/0208515 A1* | 8/2013 | Swamy | H02M 1/36 363/37 |
| 2014/0084967 A1* | 3/2014 | Hosono | H03K 17/168 327/109 |
| 2014/0198534 A1* | 7/2014 | Jovcic | H02M 3/33507 363/16 |
| 2014/0347903 A1* | 11/2014 | Ritchey | H02P 25/188 363/126 |
| 2015/0023063 A1* | 1/2015 | Perreault | H02M 3/335 363/17 |
| 2017/0027074 A1 | 1/2017 | Ichikawa | |
| 2017/0250621 A1 | 8/2017 | Townsend et al. | |
| 2020/0244178 A1* | 7/2020 | Soles | H02M 7/003 |

FOREIGN PATENT DOCUMENTS

| | | |
|---|---|---|
| EP | 0590502 A2 | 4/1994 |
| EP | 2876797 A2 | 5/2015 |

* cited by examiner

INVERTER SYSTEM

CROSS-REFERENCE TO RELATED APPLICATIONS

The present application claims priority to Chinese Patent Application No. 201920592419.9, titled "INVERTER SYSTEM", filed on Apr. 26, 2019, with the China National Intellectual Property Administration, which is incorporated herein by reference in its entirety.

FIELD

The present disclosure relates to the technical field of power electronics technology, and in particular, to an inverter system.

BACKGROUND

A conventional inverter system increases a power level of the inverter system without changing stress of switches by directly connecting multiple inverter modules in parallel. However, when currents flowing in the multiple inverter modules are not uniform, it is inevitable that a current flowing in an individual inverter module exceeds a current-carrying limit of said inverter module, which will cause an overcurrent damage of said inverter module.

SUMMARY

In view of the above, the present disclosure provides an inverter system in which the magnitudes of currents flowing through the inverter modules are substantially equal.

An inverter system includes multiple inverter modules connected in parallel, where input terminals of all the inverter modules are connected to a same direct current input bus, and output terminals of all the inverter modules are connected to a same alternating current output bus, and an input contact S1 of the direct current input bus and an output contact S2 of the alternating current output bus are located in a manner that a difference between impedances of each two branches between S1 and S2 is less than or equal to a preset value.

In an embodiment, the multiple inverter modules are sequentially arranged in a vertical direction, S2 is located within a preset range centered on an upper left corner of the inverter system, and S1 is located within a preset range centered on a lower right corner of the inverter system.

In an embodiment, the multiple inverter module are sequentially arranged in a vertical direction, S2 is located within a preset range centered on a lower left corner of the inverter system, and S1 is located within a preset range centered on an upper right corner of the inverter system.

In an embodiment, the inverter module has an I-type three-level circuit topology including a first sub-module, a second sub-module and a third sub-module, where the first sub-module has a positive input terminal connected to a positive terminal of the direct current input bus, a negative input terminal connected to a neutral point of the direct current input bus, and an output terminal connected to a positive input terminal of the third sub-module, and the second sub-module has a positive input terminal connected to the neutral point of the direct current input bus, a negative input terminal connected to a negative terminal of the direct current input bus, and an output terminal connected to a negative input terminal of the third sub-module.

In an embodiment, the inverter system further includes a first circulation bus and a second circulation bus, where the first circulation bus is connected to the output terminal of each first sub-module, and the second circulation bus is connected to the output terminal of each second sub-module.

In an embodiment, heat dissipation fins with sparse and dense regions are provided on a housing of the inverter, where the multiple inverter modules in the inverter system are sequentially arranged in a vertical direction, and cold air enters through a bottom of the inverter system and flows out through a top of the inverter system; and the heat dissipation fins are sparse near a cold air side, and are dense near a hot air side.

In an embodiment, each of the multiple inverter modules is provided with multiple heat pipes, and the heat pipes transfer heat that is not taken away by cold air to an area without heat generation or with less heat generation in the inverter module.

In an embodiment, the multiple inverter modules in the inverter system are sequentially arranged in a vertical direction, and cold air enters through a bottom of the inverter system and flows out through a top of the inverter system;

the first sub-module and the second sub-module are arranged in a vertical direction;

in a horizontal direction of the inverter module, the first sub-module and the second sub-module are arranged at one side in the inverter module, and the third sub-module is arranged at another side in the inverter module; and first, second, third and fourth heat pipes are provided in the inverter module, where the first heat pipe has a first end arranged on a surface of the first sub-module and a second end arranged in an area where the third sub-module is not installed, the second heat pipe has a third end arranged on the surface of the first sub-module and a fourth end arranged in the area where the third sub-module is not installed, the third heat pipe has a fifth end arranged on a surface of the second sub-module and a sixth end arranged on a surface of the third sub-module, and the fourth heat pipe has a seventh end arranged on the surface of the second sub-module and an eighth end arranged in the area where the third sub-module is not installed.

As can be seen from the above technical solutions, the present disclosure provides a positional relationship between an input contact S1 of a direct current input bus and an output contact S2 of an alternating current output bus so that impedances of all branches between S1 and S2 are equal (or substantially equal). Thus, currents flowing through all the inverter modules are equal (or substantially equal), thereby solving the problems existing in the prior art.

BRIEF DESCRIPTION OF THE DRAWINGS

For clearer illustration of the technical solutions according to embodiments of the present disclosure or conventional techniques, hereinafter are briefly described the drawings to be applied in embodiments of the present disclosure or conventional techniques. Apparently, the drawings in the following descriptions are only some embodiments of the present disclosure, and other drawings may be obtained by those skilled in the art based on the provided drawings without creative efforts.

DETAILED DESCRIPTION OF EMBODIMENTS

The technical solution of the present disclosure is hereinafter described in detail with reference to the accompanying drawings. It is evident that the embodiments are only some exemplary embodiments of the present disclosure, and the present disclosure is not limited to such embodiments. Other embodiments that those skilled in the art obtain based on embodiments of the present disclosure also all within the protection scope of the present disclosure.

Figure 1:
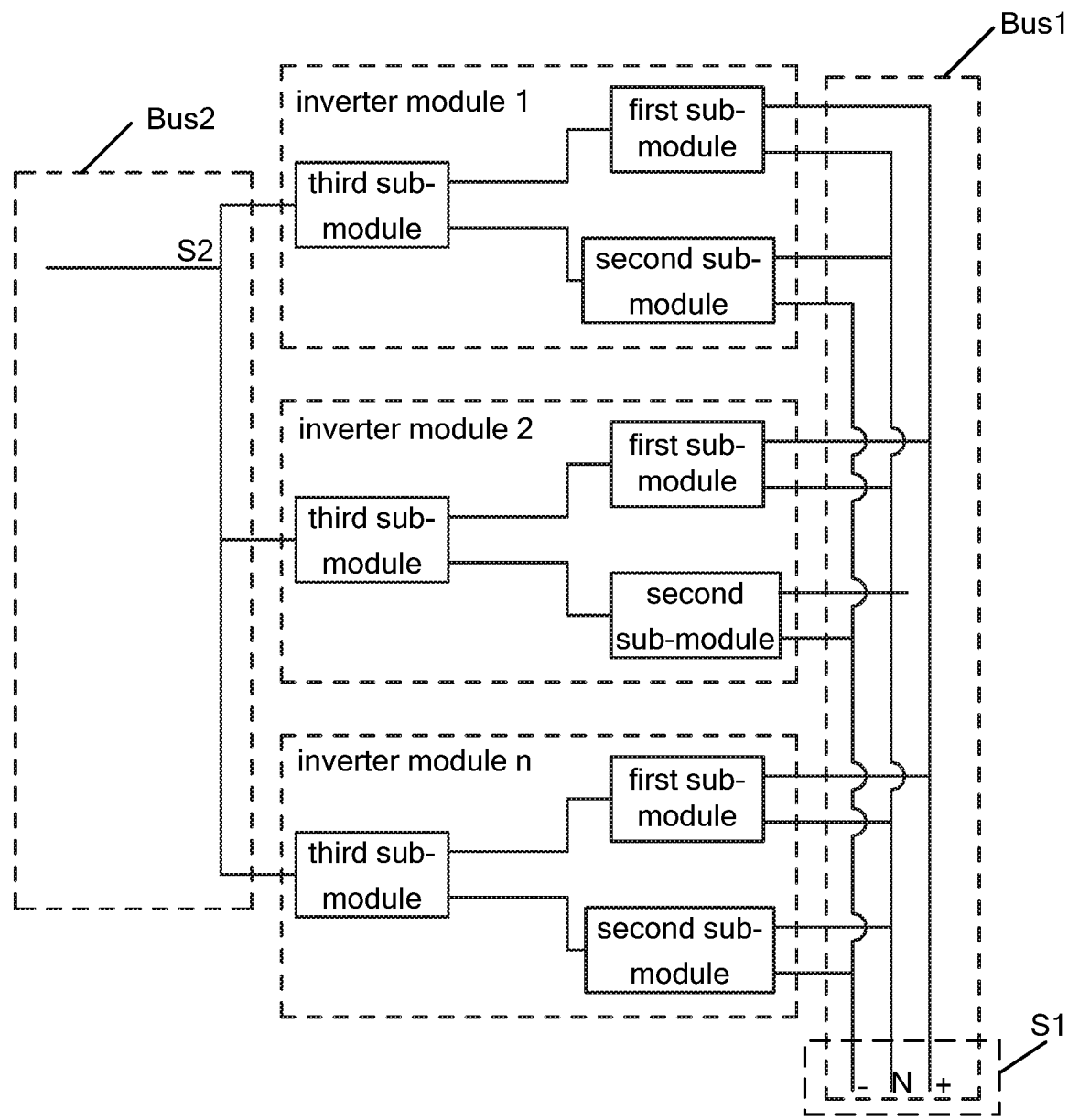
FIG. 1 is a schematic diagram of a structure of an inverter system according to an embodiment of the present disclosure.

Referring to FIG. 1, an embodiment of the present disclose provides an inverter system including multiple inverter modules connected in parallel (assuming that there are n inverter modules connected in parallel, where for convenience of description, the n inverter modules are respectively identified as inverter module 1, inverter module 2, . . . , inverter module n).

Input terminals of all the inverter modules are connected to a same direct current input bus Bus1, and output terminals of all the inverter modules are connected to a same alternating current output bus Bus2.

An input contact S1 of the direct current input bus Bus1 and an output contact S2 of the alternating current output bus Bus2 are located in a manner that a difference between impedances of each two branches between S1 and S2 does not exceed a preset value (the preset value is zero or a value very close to zero).

From the above description, a power level of the inverter system is increased without changing stress of switches by directly connecting multiple inverter modules in parallel according to the embodiment of the present disclosure. At the same time, the embodiment of the present disclosure provides a positional relationship between an input contact S1 of a direct current input bus Bus1 and an output contact S2 of an alternating current output bus Bus2, so that impedances of all branches between S1 and S2 are equal (or substantially equal). Thus, currents flowing through all the inverter modules are equal (or substantially equal), thereby solving the problems existing in the prior art.

Figure 2:
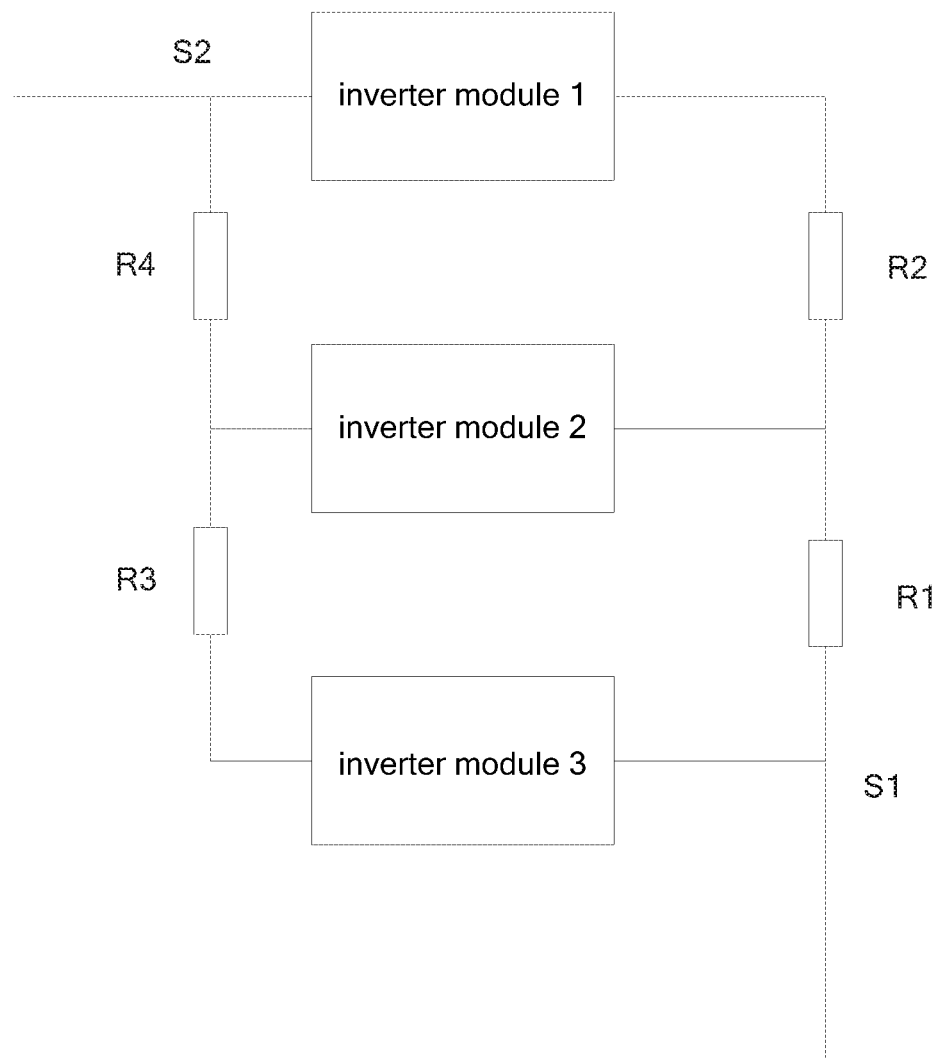
FIG. 2 is a schematic diagram of a position distribution of S1 and S2 according to an embodiment of the present disclosure.
Figure 3:
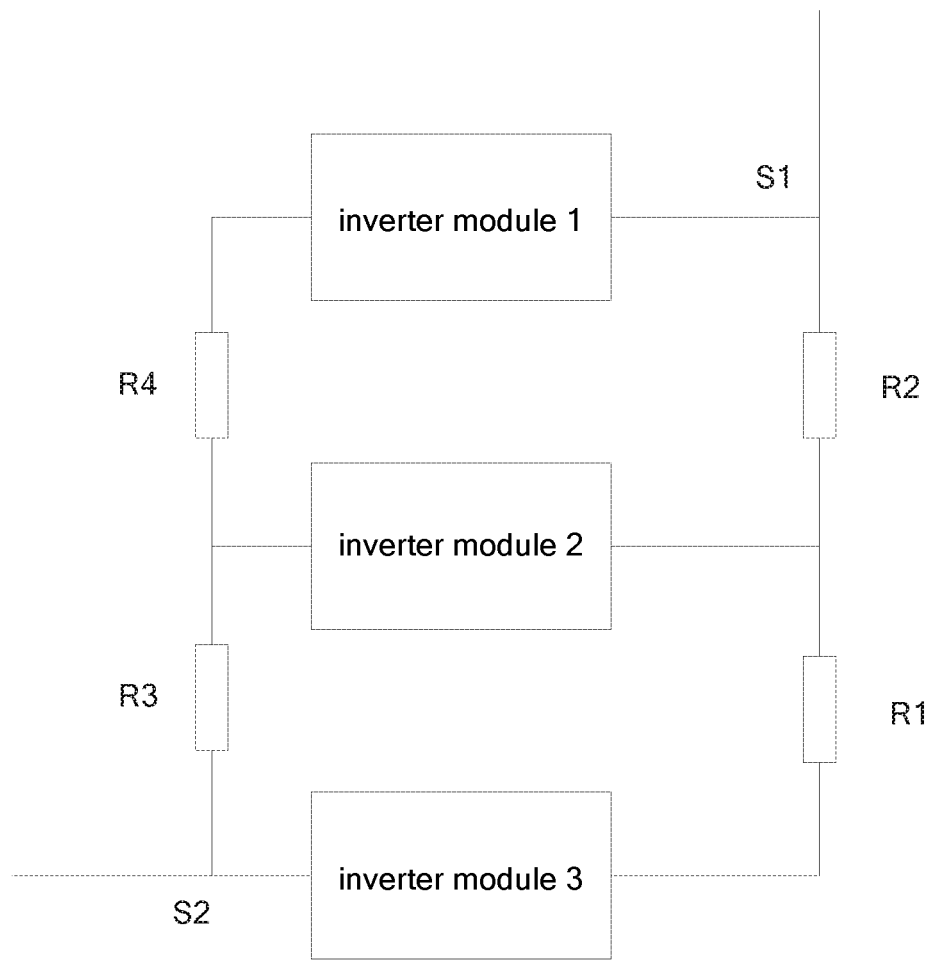
FIG. 3 is a schematic diagram of a position distribution of S1 and S2 according to another embodiment of the present disclosure.

For example, as shown in FIG. 2 or FIG. 3, n=3. The inverter module 1, the inverter module 2, and the inverter module 3 are arranged sequentially in a vertical direction from top to bottom. An impedance value of the direct current input bus Bus1 connected between an input terminal of the inverter module 3 and an input terminal of the inverter module 2 is defined as R1, an impedance value of the direct current input bus Bus1 connected between the input terminal of the inverter module 2 and an input terminal of the inverter module 1 is defined as R2, an impedance value of the alternating current output bus Bus2 connected between an output terminal of the inverter module 3 and an output terminal of the inverter module 2 is defined as R3, and an impedance value of the alternating current output bus Bus2 connected between the output terminal of the inverter module 2 and an output terminal of the inverter module 1 is defined as R4.

In a case that R1=R2=R3=R4, and impedance values of the inverter module 1, the inverter module 2, and the inverter module 3 are also equal, S2 and S1 should satisfy a position requirement that S2 and S1 form a diagonal. In an embodiment, as shown in FIG. 2, S2 is arranged at an upper left corner of the inverter system, and S1 is arranged at a lower right corner of the inverter system; or, as shown in FIG. 3, S2 is arranged at a lower left corner of the inverter system, and S1 is arranged at an upper right corner of the inverter system. In FIG. 2 and FIG. 3, there are three current branches between S1 and S2: S1→the inverter module 3→R3→R4→S2, S1→R1→the inverter module 2→R4→S2, and S1→R1→R2→the inverter module 1→S2. Since the impedances of all branches between S1 and S2 are equal, currents flowing through the inverter module 1, the inverter module 2, and the inverter module 3 are all equal.

In practice, in a case that there is a difference between R1, R2, R3, R4, and/or between the impedance values of the inverter module 1, the inverter module 2, and the inverter module 3, the relative positions of S2 and S1 in FIG. 2 and FIG. 3 need to be adjusted appropriately until it is verified through tests that the impedances of all branches between S1 and S2 are equal (or substantially equal). In an embodiment, the appropriate adjustment for FIG. 2 includes determining a position of S2 within a preset range centered on the upper left corner of the inverter system, and determining a position of S1 within a preset range centered on the lower right corner of the inverter system. The appropriate adjustment for FIG. 3 includes determining a position of S2 within a preset range centered on the lower left corner of the inverter system, and determining a position of S1 within a preset range centered on the upper right corner of the inverter system.

Figure 4:
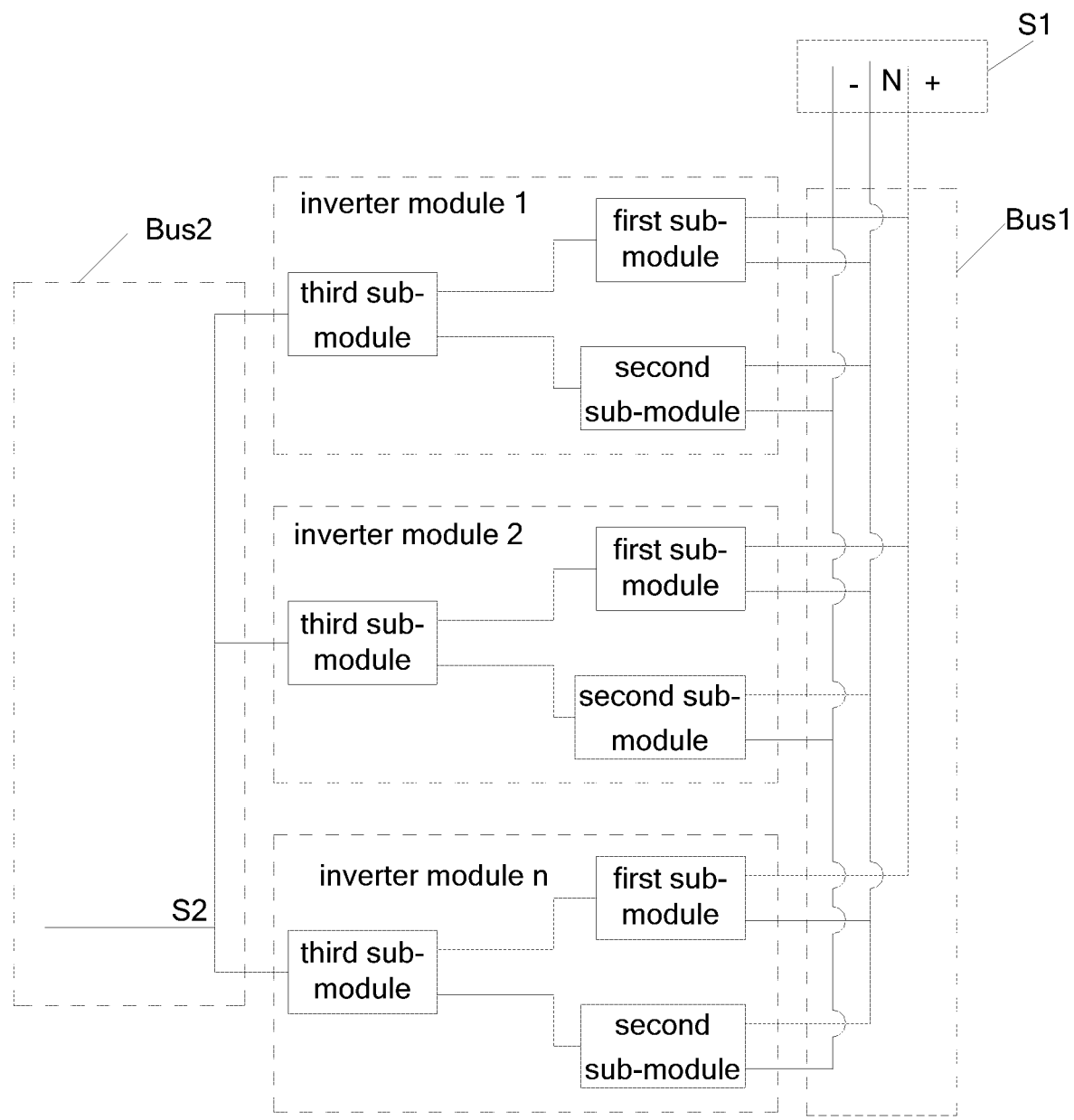
FIG. 4 is a schematic diagram of a structure of an inverter system according to another embodiment of the present disclosure.

The relative positions of S2 and S1 in FIG. 1 are provided based on FIG. 2, where the position of S2 is within the preset range centered on the upper left corner of the inverter system, and the position of S1 is within the preset range centered on the lower right corner of the inverter system. In a case that the inverter system is provided based on FIG. 3, the position of S2 is within the preset range centered on the lower left corner of the inverter system, and the position of S1 is within the preset range centered on the upper right corner of the inverter system, in which case a schematic structure diagram of the inverter system as shown in FIG. 4 is obtained.

In an embodiment, the inverter system in the embodiment of the present disclosure may be an inverter system with a three-level circuit topology or an inverter system with a five-level circuit topology, which is not limited. Compared with the inverter system with the five-level circuit topology, the inverter system with the three-level circuit topology has the advantages of high switching frequency, low output harmonic content, and high system efficiency, which has a wide range of applications in new energy generation and other fields.

In the inverter system with the three-level circuit topology, the inverter module may adopt an I-type three-level circuit topology to meet the high current level of the inverter system. Referring to FIG. 1 or FIG. 4, the I-type three-level circuit topology includes: a first sub-module, a second sub-module, and a third sub-module, and the first sub-module, the second sub-module, and the third sub-module are connected to form an I-type topology.

The I-type topology means that a positive input terminal of the first sub-module is connected to a positive terminal of the direct current input bus Bus1, a negative input terminal of the first sub-module is connected to a neutral point N of the direct current input bus Bus1, a positive input terminal of the second sub-module is connected to the neutral point of the direct current input bus Bus1, a negative input terminal of the second sub-module is connected to a negative terminal of the direct current input bus Bus1, an output terminal of the first sub-module is connected to a positive input terminal of the third sub-module, and an output terminal of the second sub-module is connected to a negative input terminal of the third sub-module.

In an embodiment, in any of the inverter systems disclosed above, in a case that the inverter module adopts the I-type three-level circuit topology, the inverter system further includes a first circulation bus L1 and a second circulation bus L2. The first circulation bus L1 is connected to the output terminal of each first sub-module, and the second circulation bus L2 is connected to the output terminal of each second sub-module, as shown in FIG. 5.

Figure 5:
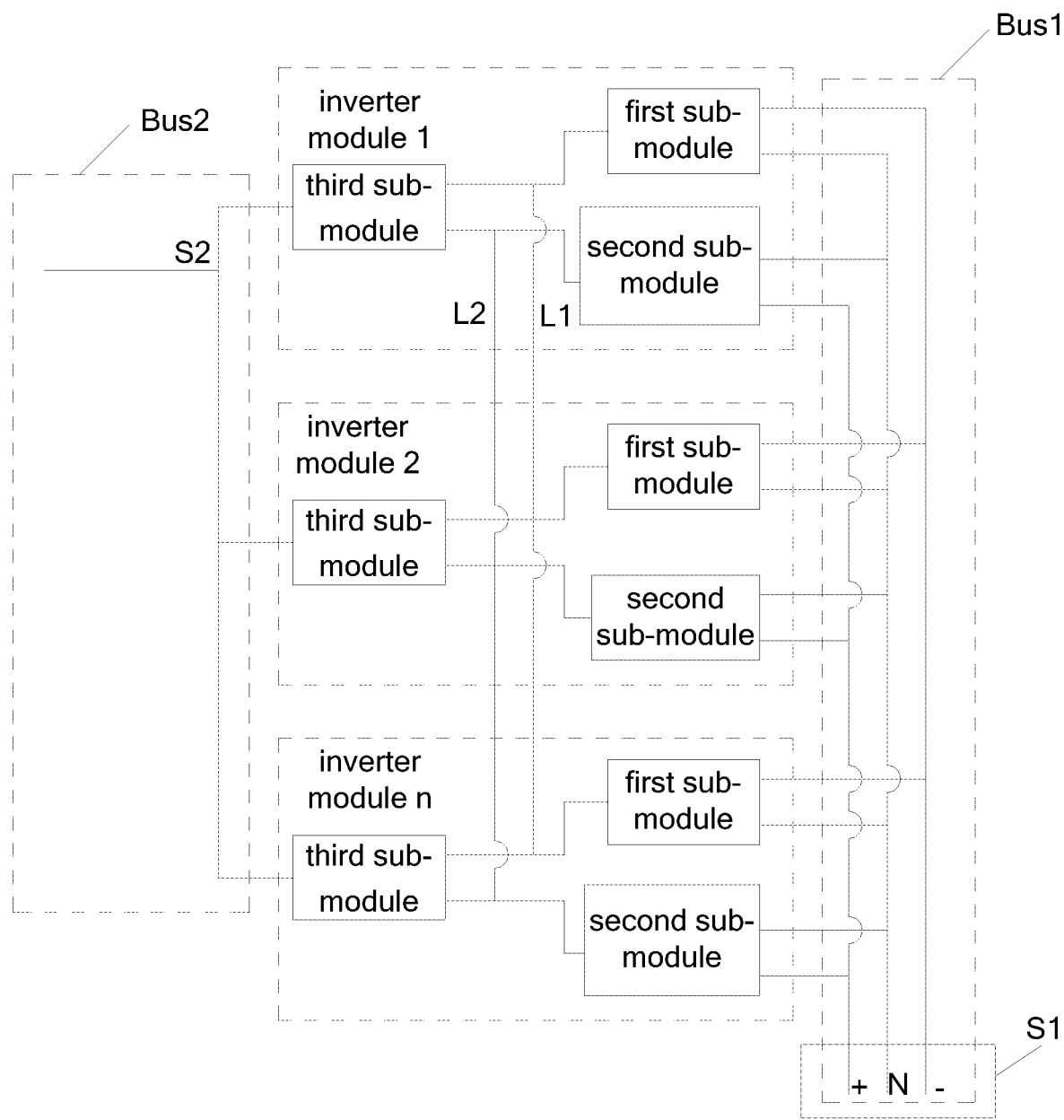
FIG. 5 is a schematic diagram of a structure of an inverter system according to another embodiment of the present disclosure.

In FIG. 5, output potentials of all the first sub-modules are equalized by the first circulation bus L1, and output potentials of all the second sub-modules are equalized by the second circulation bus L2. In this way, currents flowing through the third module are balanced, thereby avoiding the current overload or even damage to the corresponding third sub-module caused by the damage of an individual first sub-module or an individual second sub-module.

The inverter system disclosed above needs guaranteed heat dissipation performance for each internal inverter module while ensuring the circuit design and function implementation. The heat dissipation performance of the inverter module is of great significance to the stability, product reliability, and service life of the power device of the entire inverter system. Therefore, in the embodiment of the present disclosure according to any of the inverter systems disclosed above, heat dissipation fins with sparse and dense regions are provided on a housing of the inverter system, and/or multiple heat pipes are provided inside the inverter system (the heat pipe uses the principle of heat conduction and the fast heat transfer property of the phase change medium to quickly transfer the heat of the heating object to the heat source, and its heat conduction capacity exceeds that of any known metal).

Figure 6:
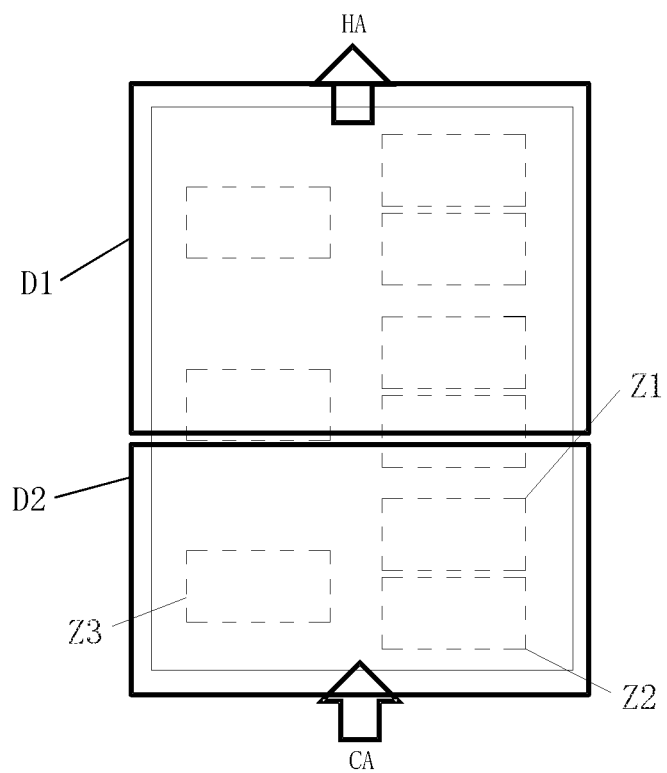
FIG. 6 is a schematic diagram of a heat dissipation design of an inverter system according to an embodiment of the present disclosure.

In an embodiment, the inverter modules in the inverter system are sequentially arranged in a vertical direction, and cold air enters through a bottom of the inverter system and flows out through a top of the inverter system. In order to ensure uniform heat dissipation and temperature of the inverter modules in a longitudinal direction, the heat dissipation fins are sparse near a cold air side, and are dense near a hot air side, as shown in FIG. 6. In FIG. 6, legend D1 denotes a dense region, and legend D2 denotes a sparse region; legends Z1, Z2, and Z3 denote the first sub-module, the second sub-module, and the third sub-module in one module, respectively; and legend CA denotes cold air, and legend HA denotes hot air. Legends Z1, Z2, Z3, CA, and HA are still used in FIG. 7 and FIG. 8 below, and legends D1, D2 in FIG. 7 and FIG. 8 denote the same elements as in FIG. 6. Among them, sizes of the sparse region and dense region are determined by practical situations.

In any of the inverter systems disclosed above, the inverter modules in the inverter system are sequentially arranged in a vertical direction, and cold air enters through the bottom of the inverter system and flows out through the top of the inverter system. Each inverter module is provided with multiple heat pipes, and the heat that cannot be taken away by the cold air is transferred to a module area where no power module is installed or a power consumption is small (that is, a region without any heat generation or with less heat generation). Thereby, the temperature of the inverter module is substantially uniform in a horizontal direction. Among them, the number of heat pipes and the specific layout are determined according to actual needs.

Figure 7:
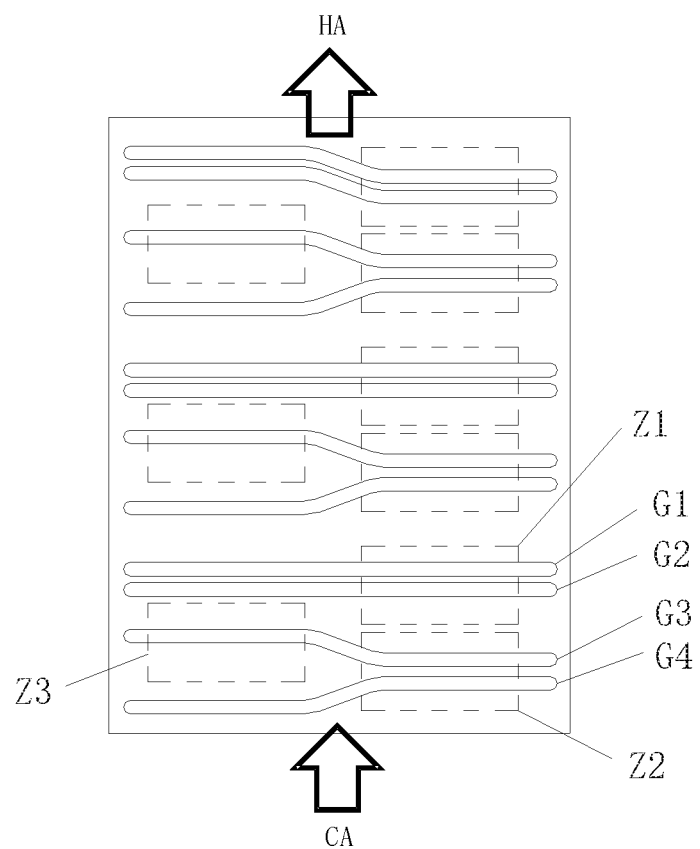
FIG. 7 is a schematic diagram of a heat dissipation design of an inverter system according to another embodiment of the present disclosure.

For example, as shown in FIG. 7, in a case that the inverter module has an I-type three-level circuit topology, the inverter system may have the following internal configurations. The first sub-module and the second sub-module are arranged in a vertical direction (the first sub-module may be disposed right above the second sub-module, as shown in FIG. 7; or the second sub-module may be disposed right above the first sub-module). In a horizontal direction of the inverter module, the first sub-module and the second sub-module are arranged at one side in the inverter module, and the third sub-module is arranged on the other side in the inverter module (for example, the first sub-module and the second sub-module are arranged at a right side in the inverter module, and the third sub-module is arranged at a left side of the inverter module). The internal configuration of each inverter module is the same.

With continued reference to FIG. 7, in the embodiment, four heat pipes are provided for each inverter module (legends G1, G2, G3, and G4 in FIG. 7 donate heat pipe 1, heat pipe 2, heat pipe 3, and heat pipe 4, respectively, and the legends G1, G2, G3, G4 in FIG. 8 below denote the same elements as in FIG. 7), as the three sub-modules in the inverter module generate the same amount of heat and heat accumulation may happen due to the fact that the first sub-module and the second sub-module are arranged in a longitudinal heat dissipation direction. One end of heat pipe 1 is arranged on a surface of the first sub-module, and another end of the heat pipe 1 is arranged in an area where the third sub-module is not installed, which is also the case for heat pipe 2; one end of heat pipe 4 is arranged on a surface of the second sub-module, and anther end of the heat pipe 4 is arranged in the area where the third sub-module is not installed; and one end of heat pipe 3 is arranged on the surface of the second sub-module, and another end of heat pipe 3 is arranged on the surface of the third sub-module. The heat pipe 1 and the heat pipe 2 transfer a part of the heat of the first sub-module to an area without a heat source on the left side; the heat pipe 4 transfers a part of the heat of the second sub-module to the area without a heat source on the left side; and the heat pipe 3 transfers a part of the heat of the second sub-module to an area where the third sub-module is located. In this way, uniform temperature in the horizontal direction is achieved and the heat accumulation is avoided by using the heat pipe 1, the heat pipe 2, the heat pipe 3, and the heat pipe 4.

Figure 8:
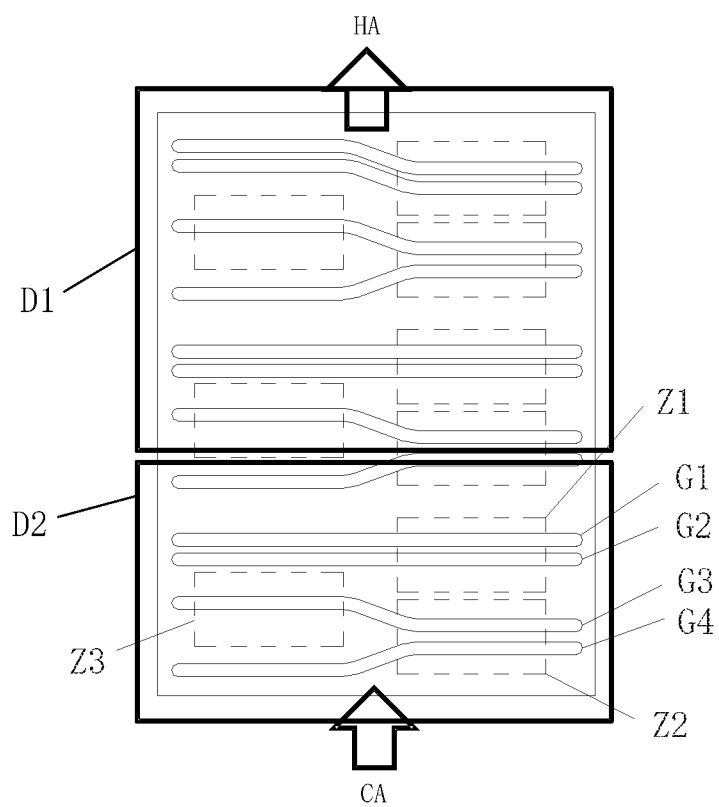
FIG. 8 is a schematic diagram of a heat dissipation design of an inverter system according to another embodiment of the present disclosure.

In an embodiment of the present disclosure, the heat dissipation methods of FIG. 6 and FIG. 7 are combined in application, based on which the embodiment shown in FIG. 8 is obtained. The housing of the inverter system is provided with heat dissipation fins that are non-uniformly distributed, realizing uniform heat dissipation in the longitudinal direction, and multiple heat pipes are provided inside the inverter system, uniform temperature in the horizontal direction is achieved, thereby avoiding heat accumulation in both directions.

The embodiments of the present disclosure are described in a progressive manner. Each embodiment focuses on the differences from other embodiments. Reference may be made to each other of the embodiments for the same and similar parts between the embodiments.

It should also be noted that the relationship terms such as "first", "second" and the like are only used herein to distinguish one entity or operation from one another, rather than to necessitate or imply that an actual relationship or order exists between the entities or operations. Furthermore, the terms such as "include", "comprise" or any other variants thereof means to be non-exclusive, so that a process, a method, an article or a device including a series of elements include not only the disclosed elements but also other elements that are not clearly enumerated, or further include inherent elements of the process, the method, the article or the device. Unless expressively limited, the statement "including a . . . " preceding an element does not exclude the existence of other similar elements in the process, the method, the article or the device other than the enumerated elements.

According to the description of the disclosed embodiments, those skilled in the art can implement or use the present disclosure. Various modifications made to these embodiments may be obvious to those skilled in the art, and the general principle defined herein may be implemented in other embodiments without departing from the spirit or scope of the present disclosure. Therefore, the present disclosure is not limited to the embodiments described herein but conforms to a widest scope in accordance with principles and novel features disclosed in the present disclosure.

The invention claimed is:

1. An inverter system, comprising a plurality of current branches between an input contact S1 of a direct current input bus and an output contact S2 of an alternating current output bus, each of the plurality of current branches comprising a respective one of a plurality of inverter modules, wherein the plurality of inverter modules is electrically connected in parallel with each other, wherein:
   input terminals of all of the plurality of inverter modules are connected to the direct current input bus, and output terminals of all of the plurality of inverter modules are connected to the alternating current output bus; and
   the input contact S1 and the output contact S2 are so located that a difference between impedances of any two of the plurality of current branches between S1 and S2 is less than or equal to a preset value, the preset value being zero or approximately zero,
   wherein the plurality of inverter modules is sequentially arranged in a vertical direction, S2 is located within a preset range centered on an upper left corner of the inverter system, and S1 is located within a preset range centered on a lower right corner of the inverter system; or
   the plurality of inverter module is sequentially arranged in a vertical direction, S2 is located within a preset range centered on a lower left corner of the inverter system, and S1 is located within a preset range centered on an upper right corner of the inverter system.

2. The inverter system according to claim 1, wherein the inverter module has an I-type three-level circuit topology comprising a first sub-module, a second sub-module and a third sub-module,
   wherein the first sub-module has a positive input terminal connected to a positive terminal of the direct current input bus, a negative input terminal connected to a neutral point of the direct current input bus, and an output terminal connected to a positive input terminal of the third sub-module, and
   the second sub-module has a positive input terminal connected to the neutral point of the direct current input bus, a negative input terminal connected to a negative terminal of the direct current input bus, and an output terminal connected to a negative input terminal of the third sub-module.

3. The inverter system according to claim 2, further comprising a first circulation bus and a second circulation bus,
   wherein the first circulation bus is connected to the output terminal of each first sub-module, and the second circulation bus is connected to the output terminal of each second sub-module.

4. The inverter system according to claim 1, wherein heat dissipation fins with sparse and dense regions are provided on a housing of the inverter,
   wherein the plurality of inverter modules in the inverter system is sequentially arranged in a vertical direction, and cold air enters through a bottom of the inverter system and flows out through a top of the inverter system; and
   the heat dissipation fins are sparse near a cold air side, and are dense near a hot air side.

5. The inverter system according to claim 1, wherein each of the plurality of inverter modules is provided with a plurality of heat pipes, and the heat pipes transfer heat that is not taken away by cold air to an area without heat generation or with less heat generation in the inverter module.

6. The inverter system according to claim 2, wherein:
   the plurality of inverter modules in the inverter module is sequentially arranged in a vertical direction, and cold air enters through a bottom of the inverter system and flows out through a top of the inverter system;
   the first sub-module and the second sub-module are arranged in a vertical direction;
   in a horizontal direction of the inverter module, the first sub-module and the second sub-module are arranged at one side in the inverter module, and the third sub-module is arranged at another side in the inverter module; and
   first, second, third and fourth heat pipes are provided in the inverter module, wherein the first heat pipe has a first end arranged on a surface of the first sub-module and a second end arranged in an area where the third sub-module is not installed, the second heat pipe has a third end arranged on the surface of the first sub-module and a fourth end arranged in the area where the third sub-module is not installed, the third heat pipe has a fifth end arranged on a surface of the second sub-module and a sixth end arranged on a surface of the third sub-module, and the fourth heat pipe has a seventh end arranged on the surface of the second sub-module and an eighth end arranged in the area where the third sub-module is not installed.

7. The inverter system according to claim 1, wherein heat dissipation fins with sparse and dense regions are provided on a housing of the inverter,
   wherein the plurality of inverter modules in the inverter system is sequentially arranged in a vertical direction, and cold air enters through a bottom of the inverter system and flows out through a top of the inverter system; and the heat dissipation fins are sparse near a cold air side, and are dense near a hot air side.

8. The inverter system according to claim 1, wherein heat dissipation fins with sparse and dense regions are provided on a housing of the inverter, wherein the plurality of inverter modules in the inverter system is sequentially arranged in a vertical direction, and cold air enters through a bottom of the inverter system and flows out through a top of the inverter system; and the heat dissipation fins are sparse near a cold air side, and are dense near a hot air side.

9. The inverter system according to claim 2, wherein heat dissipation fins with sparse and dense regions are provided on a housing of the inverter, wherein the plurality of inverter modules in the inverter system is sequentially arranged in a vertical direction, and cold air enters through a bottom of the inverter system and flows out through a top of the inverter system; and the heat dissipation fins are sparse near a cold air side, and are dense near a hot air side.

10. The inverter system according to claim 3, wherein heat dissipation fins with sparse and dense regions are provided on a housing of the inverter, wherein the plurality of inverter modules in the inverter system is sequentially arranged in a vertical direction, and cold air enters through a bottom of the inverter system and flows out through a top of the inverter system; and the heat dissipation fins are sparse near a cold air side, and are dense near a hot air side.

11. The inverter system according to claim 1, wherein each of the plurality of inverter modules is provided with a plurality of heat pipes, and the heat pipes transfer heat that is not taken away by cold air to an area without heat generation or with less heat generation in the inverter module.

12. The inverter system according to claim 1, wherein each of the plurality of inverter modules is provided with a plurality of heat pipes, and the heat pipes transfer heat that is not taken away by cold air to an area without heat generation or with less heat generation in the inverter module.

13. The inverter system according to claim 2, wherein each of the plurality of inverter modules is provided with a plurality of heat pipes, and the heat pipes transfer heat that is not taken away by cold air to an area without heat generation or with less heat generation in the inverter module.

14. The inverter system according to claim 3, wherein each of the plurality of inverter modules is provided with a plurality of heat pipes, and the heat pipes transfer heat that is not taken away by cold air to an area without heat generation or with less heat generation in the inverter module.

15. The inverter system according to claim 3, wherein:

the plurality of inverter modules in the inverter module is sequentially arranged in a vertical direction, and cold air enters through a bottom of the inverter system and flows out through a top of the inverter system;

the first sub-module and the second sub-module are arranged in a vertical direction;

in a horizontal direction of the inverter module, the first sub-module and the second sub-module are arranged at one side in the inverter module, and the third sub-module is arranged at another side in the inverter module; and first, second, third and fourth heat pipes are provided in the inverter module, wherein the first heat pipe has a first end arranged on a surface of the first sub-module and a second end arranged in an area where the third sub-module is not installed, the second heat pipe has a third end arranged on the surface of the first sub-module and a fourth end arranged in the area where the third sub-module is not installed, the third heat pipe has a fifth end arranged on a surface of the second sub-module and a sixth end arranged on a surface of the third sub-module, and the fourth heat pipe has a seventh end arranged on the surface of the second sub-module and an eighth end arranged in the area where the third sub-module is not installed.

* * * * *